(12) United States Patent
Asaad et al.

(10) Patent No.: US 9,002,693 B2
(45) Date of Patent: Apr. 7, 2015

(54) WIRE LIKE LINK FOR CYCLE REPRODUCIBLE AND CYCLE ACCURATE HARDWARE ACCELERATOR

(75) Inventors: Sameh Asaad, Briarcliff Manor, NY (US); Mohit Kapur, Sleepy Hollow, NY (US); Benjamin D. Parker, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 13/342,128

(22) Filed: Jan. 2, 2012

(65) Prior Publication Data
US 2013/0170525 A1 Jul. 4, 2013

(51) Int. Cl.
*G06F 17/50* (2006.01)
(52) U.S. Cl.
CPC .................. *G06F 17/5027* (2013.01)
(58) Field of Classification Search
USPC .......................................................... 703/15
See application file for complete search history.

(56) References Cited

U.S. PATENT DOCUMENTS

| 7,506,297 | B2 | 3/2009 | Mukherjee |
| 7,603,540 | B2 | 10/2009 | Doering |
| 7,640,528 | B1 | 12/2009 | Baeckler |
| 7,797,667 | B1 | 9/2010 | Baeckler |
| 7,969,187 | B1 | 6/2011 | Neuendorffer |
| 2005/0081170 | A1 | 4/2005 | Hyduke |
| 2007/0116465 | A1* | 5/2007 | Bieker ............................ 398/70 |
| 2009/0254505 | A1 | 10/2009 | Davis |

FOREIGN PATENT DOCUMENTS

CN 1867893 11/2006

OTHER PUBLICATIONS

Altera Corporation: 5. High-Speed Differential I/O Interfaces in Stratix Devices; Stratix Device Handbook, vol. 1; Altera Corporation; 2005; pp. 5-1 to 5-76.*
Sides et al.: SERDES Interfaces in an FPGA World: What Do I Need to Know to Get Started?; Published on Wireless Design & Development (http://www.wirelessdesignmag.com); 2007; pp. 1-9.*
Patel: The basics of SerDes (serializers/deserializers) for interfacing; Planet Analog—Articles—The basics of SerDes (serializers/deserializers) for interfacing; Sep. 2010; pp. 1-8.*
Stauffer et al,; High Speed Serdes Devices and Applications; 2008 Springer Science; 495 pages.*

(Continued)

*Primary Examiner* — Hugh Jones
(74) *Attorney, Agent, or Firm* — Anne V. Dougherty; Otterstedt, Ellenbogen & Kammer, LLP

(57) ABSTRACT

First and second field programmable gate arrays are provided which implement first and second blocks of a circuit design to be simulated. The field programmable gate arrays are operated at a first clock frequency and a wire like link is provided to send a plurality of signals between them. The wire like link includes a serializer, on the first field programmable gate array, to serialize the plurality of signals; a deserializer on the second field programmable gate array, to deserialize the plurality of signals; and a connection between the serializer and the deserializer. The serializer and the deserializer are operated at a second clock frequency, greater than the first clock frequency, and the second clock frequency is selected such that latency of transmission and reception of the plurality of signals is less than the period corresponding to the first clock frequency.

24 Claims, 7 Drawing Sheets

(56) References Cited

OTHER PUBLICATIONS

Athavale et al.; High-Speed Serial I/O Made Simple, Designer's Guide with FPGA Applications; Connectivity Solutions Edition 1.0; Xilinx, Inc; 2005; 210 pages.*

Sunter: An Automated, Complete, Structural Test Solution for SERDES; 2004 ITC International Test Conference; 2004, pp. 95-104.*

Schleupen et al.; Dynamic Partial FPGA Reconfiguration in a Prototype Microprocessor System; IEEE; 2007; 533-536.*

SERDES Handbook; 2003 Lattice Semiconductor Corporation 2003; 98 pages.*

Chao Wang, et al. "An Application Mapping Scheme over Distributed Reconfigurable System" IEEE 2009 15th Intl. Conf. Parallel Dist. Systems., pp. 535-542 (IEEE 2009).

* cited by examiner

FIG. 2

CLK2 @ 1GHz (Ft) 221

1 BIT MUX OUTPUT FROM FPGA1 @ 1Gb/s (M = 10)
DATA 1 223
|1|2|3|4|5|6|7|8|9|10|
LATENCY N = 8

↓20
DATA 2 231
|1|2|3|4|5|6|7|8|9|10|

10 BIT DMUX OUTPUT IN FPGA2
227

233

B = 2

10 BIT DATA @ CLK12
CLK12 @ 50MHz  225
DATA 1  229

WIRE LIKE LINK FOR CYCLE REPRODUCIBLE AND CYCLE ACCURATE HARDWARE ACCELERATOR

STATEMENT OF GOVERNMENT RIGHTS

This invention was made with Government support under Contract No.: B554331 awarded by the Department of Energy (DOE). The Government has certain rights in this invention.

CROSS-REFERENCE TO RELATED APPLICATIONS

Not Applicable.

FIELD OF THE INVENTION

The present invention relates to the electrical, electronic and computer arts, and, more particularly, to simulation of integrated circuit (IC) chips and the like.

BACKGROUND OF THE INVENTION

As system-on-chip and multiple processor cores on a single chip are becoming common practice, simulating these complex chips is, in turn, becoming expensive and challenging. One of the techniques adopted in simulating these complex systems is Field Programmable Gate Array (FPGA) based hardware accelerators. These hardware accelerators work on the principle of dividing the chip design (device under test, referred to herein as "DUT") into small blocks. These blocks are then implemented on various FPGAs. These FPGAs are inter-connected to each other in the same fashion as is the original DUT design. The chip or DUT simulations can now be run on this specialized FPGA hardware instead of running them on a conventional simulator. Conventional simulators are completely written in software and run on a general purpose computer. Hardware simulators can typically give a speed advantage of 100- to 1000-fold over conventional simulators.

SUMMARY OF THE INVENTION

Principles of the invention provide techniques for a wire like link for a cycle reproducible and cycle accurate hardware accelerator. In one aspect, an exemplary method includes the steps of providing first and second field programmable gate arrays implementing, respectively, first and second blocks of a circuit design to be simulated; operating the first and second field programmable gate arrays at a first clock frequency; and providing a wire like link to send a plurality of signals between the first and second field programmable gate arrays. The wire like link includes a serializer, on the first field programmable gate array, to serialize the plurality of signals; a deserializer on the second field programmable gate array, to deserialize the plurality of signals; and a connection between the serializer and the deserializer. A further step includes operating the serializer and the deserializer at a second clock frequency, greater than the first clock frequency, the second clock frequency being selected such that latency of transmission and reception of the plurality of signals is less than a period corresponding to the first clock frequency.

In another aspect, an exemplary apparatus for simulating a circuit design includes first and second field programmable gate arrays implementing, respectively, first and second blocks of the circuit design to be simulated; at least a first clock source which clocks the first and second field programmable gate arrays such that they operate at a first clock frequency; and a wire like link configured to send a plurality of signals between the first and second field programmable gate arrays. The wire like link in turn includes a serializer, on the first field programmable gate array, to serialize the plurality of signals; a deserializer on the second field programmable gate array, to deserialize the plurality of signals; and a connection between the serializer and the deserializer. Also included in the apparatus is at least a second clock source which clocks the serializer and the deserializer such that they operate at a second clock frequency, greater than the first clock frequency, the second clock frequency having a value such that latency of transmission and reception of the plurality of signals is less than a period corresponding to the first clock frequency.

In still another aspect, an exemplary design structure, tangibly embodied in a non-transitory manner in a machine readable medium, includes instructions which cause first and second field programmable gate arrays to implement, respectively, first and second blocks of a circuit design to be simulated. The first field programmable gate array has as a macro thereon at least a portion of a serializer to serialize a plurality of signals to be sent over a wire like link between the first and second field programmable gate arrays. The second field programmable gate array has as a macro thereon at least a portion of a deserializer to deserialize the plurality of signals. The design structure also includes instructions which cause the first and second field programmable gate arrays to implement at least one port for receiving a signal from at least a first clock source which clocks the first and second field programmable gate arrays such that they operate at a first clock frequency; and instructions which cause the first and second field programmable gate arrays to implement at least one port for receiving a signal from at least a second clock source which clocks the serializer and the deserializer such that they operate at a second clock frequency, greater than the first clock frequency. The second clock frequency has a value such that latency of transmission and reception of the plurality of signals is less than a period corresponding to the first clock frequency.

In yet a further aspect, another exemplary method includes the steps of providing a design structure of the kind just described, and transmitting instructions corresponding to the design structure.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of means for carrying out one or more of the method steps described herein.

Some embodiments of the invention are directed to design structures for circuits used in simulation of integrated circuit designs and/or to the circuit designs.

Techniques of the present invention can provide substantial beneficial technical effects. For example, one or more embodiments may provide one or more of the following advantages:

speed advantage of up to 100,000-fold over conventional simulators;

ability to run benchmarks on a hardware simulator to verify performance of a microprocessor design early-on in the design process rather than awaiting expensive and time-consuming fabrication of a hardware prototype of the microprocessor (because software simulations of such benchmarks are unfeasible due to excessive execution times);

substantial reduction in development times and/or development costs by finding problems early-on prior to prototyping.

These and other features and advantages of the present invention will become apparent from the following detailed description of illustrative embodiments thereof, which is to be read in connection with the accompanying drawings.

BRIEF DESCRIPTION OF THE DRAWINGS

FIG. 2 shows an exemplary waveform diagram for the system of FIG. 1, according to an aspect of the invention;

DETAILED DESCRIPTION OF PREFERRED EMBODIMENTS

Figure 1:
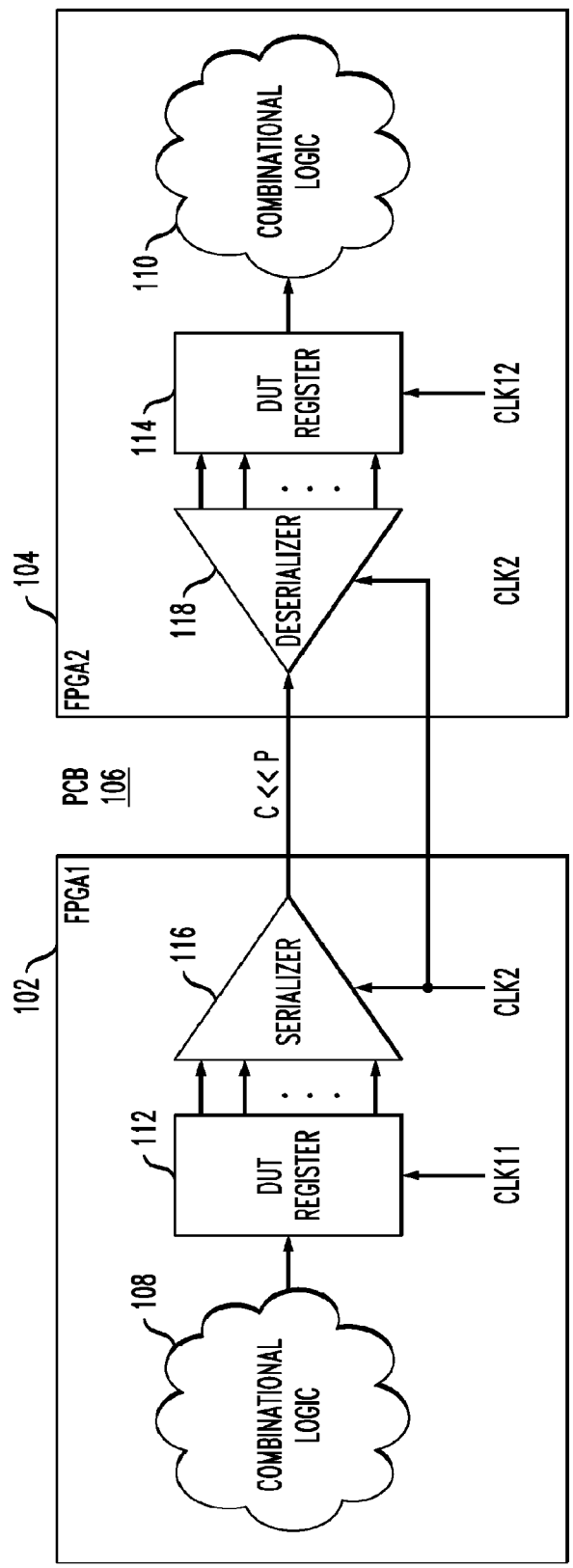
FIG. 1 shows an exemplary system including two FPGAs and a wire like link, according to an aspect of the invention.

As noted above, as system-on-chip and multiple processor cores on a single chip are becoming common practice, simulating these complex chips is, in turn, becoming expensive and challenging. One of the techniques adopted in simulating these complex systems is Field Programmable Gate Array (FPGA) based hardware accelerators. These hardware accelerators work on the principle of dividing the chip design (device under test, referred to herein as "DUT") into small blocks. These blocks are then implemented on various FPGAs. These FPGAs are inter-connected to each other in the same fashion as is the original DUT design. The chip or DUT simulations can now be run on this specialized FPGA hardware instead of running them on a conventional simulator. Conventional simulators are completely written in software and run on a general purpose computer. Hardware simulators can give typically a speed advantage of 100- to 1000-fold over conventional simulators.

One aspect noted in building these hardware accelerators is cycle accuracy. The FPGA based hardware accelerator should exactly mimic the behavior of the DUT on a cycle by cycle basis, which means that, if the DUT were simulated on a software simulator or when the DUT is built into a single or multiple chips, at any given DUT clock cycle, all three systems, namely, the hardware accelerator, the software simulator, and the DUT chip should be in the same state. This becomes an issue in the design of hardware accelerators, as the DUT design is now partitioned over multiple FPGAs communicating with each other. Because of pin limitations on the FPGAs, the signals between the FPGAs have to be multiplexed. This multiplexing and demultiplexing of signals consumes clock cycles. To maintain cycle accuracy, these multiplexers and demultiplexers typically have to run at a much higher frequency than DUT blocks, so as to hide the cycles consumed in transmission and reception of data. No additional latency should be introduced in the system, as it will cause deviation from cycle accurate behavior. These links, which exhibit less than a DUT's cycle latency, are termed as Wire Like Links (WLLs).

Another issue in building hardware simulation accelerators is cycle reproducibility, which is defined as follows: multiple executions starting from the same initial condition(s) shall yield identical trace(s) for all DUT state(s). This property is quite significant for enabling efficient debugging of the simulation. This requirement constrains how clocking and reset of the entire acceleration system is implemented. It also constrains the design of the wire like links. These high speed multiplexers and demultiplexers, also known as SerDes links, require link training, which generally involves bit, word and block alignment. These alignment techniques can take variable amounts of time to complete, depending upon the physical and electrical properties of the link. To have a cycle reproducible link, special circuits typically have to be designed into the system, in order to mitigate the effect of this variability.

One or more embodiments provide innovative circuits and techniques used in the design of WLLs for a cycle reproducible and cycle accurate hardware accelerator.

Consider now the non-limiting exemplary embodiment of a system, as illustrated in FIG. 1. For illustration, it shows two FPGAs, FPGA1 and FPGA2, designated as 102 and 104, respectively, connected to each other on a printed circuit board (PCB) 106. A hardware accelerator can have hundreds of such FPGAs connected to each other. The DUT logic which needs to be simulated using this hardware accelerator is partitioned between the two FPGAs. In general the DUT logic can be represented by a combinatorial logic cloud 108, 110 and a register 112, 114. Signals in FPGA1 102 are multiplexed or serialized, in serializer 116, before sending them to FPGA2 104. On the receive side in FPGA2 104, the signals are demultiplexed or deserialized in deserializer 118 before sending them to the DUT register 114.

Let P be the number of functional signals that need to be routed between the two FPGAs 102, 104. Let C be the number of wires available for routing on the PCB 106 (in many instances, C will be much less than P). This is usually decided by the system cost and/or the limit on the number of FPGA input/output (I/O) pins. Then the multiplex ratio, M, is defined as:

$$M = P/C \qquad (1)$$

Let CLK11 represent the clock signal which updates the DUT state in FPGA1 102. Let CLK12 be the clock signal which drives the DUT state in FPGA2 104. Both CLK11 and CLK12 should be designed to have the same frequency, although they can have different phases. CLK2 represents the clock signal which drives the serialized or multiplexed data out of FPGA1 102 and demultiplexes it at FPGA2 104. For a clock forwarded system, CLK2 is forwarded from FPGA1 102 to FPGA2 104. For a non-clock forwarded system, also known as a clock data recovery (CDR) system, there is typically a transmitter version of CLK2 and a receiver version of CLK2; these have similar frequencies (within a certain tolerance) and different phases. This exemplary embodiment describes a clock forwarded system, although the techniques described to achieve cycle accuracy and reproducibility can also be applied to a CDR based system, given the teachings herein.

Let $F_t$ be the maximum frequency at which these C wires can be operated. $F_t$ is limited by several factors, such as the quality of the printed circuit board material, transmitter/receiver design, packaging, cross-talk between wires, inter symbol interference, and the like. In FIG. 1, to maximize the performance of the system, it would be desirable to have the frequency of CLK2 to be equal to $F_t$.

Let N be the number of $F_t$ cycles required for the signal to propagate from FPGA1 102 to FPGA2 104. This includes the time to multiplex in the transmitter, the flight time between chips, and the propagation delay in the chip output driver of FPGA1 102 and the input receiver of FPGA2 104. N is also referred to as the latency of the link.

Therefore, the maximum frequency $F_s$ at which any functional signal within the chip can be operated is given by:

$$F_s \leq F_t/(M+N+B) \quad (2)$$

where B represents the extra cycles required to compensate for phase differences between CLK11 and CLK12. These extra cycles can also be used to prevent any setup and hold violations that may arise because of any jitter riding on the clock. It will be further illustrated how the selection of different values of B can, in some embodiments, yield several benefits, such as a universal block alignment circuit and a FIFO-less design (FIFO=First-In-First-Out).

Equation 2 can also be used to form the basis for cycle accurate behavior of these links. As long as the latency of transmission and reception is less than the period of the DUT cycle, the entire link will appear as a wire to the DUT. To illustrate this further, consider the exemplary circuit of FIG. 1. For example, let there be ten DUT signals which need to be routed from FPGA1 102 to FPGA2 104:

$$P=10$$

Let the maximum allowed number of wires that can routed on the printed circuit board be one.

$$C=1$$

Therefore, the multiplex ratio as computed from Equation 1 is:

$$M=10/1=10$$

Let the latency of the link including the transmitter in FPGA1 102 to the receiver in FPGA2 104 be eight cycles of CLK2. Let the number of buffer cycles to re-latch the data in FPGA2 be two:

$$N=8, B=2$$

Let the maximum frequency at which this link can be operated be 1 GHz:

$$F_t=1 \text{ GHz}$$

Therefore, the maximum frequency at which FPGA1 102 and FPGA2 104 can operate is:

$$F_s=1 \text{ GHz}/(10+8+2)=50 \text{ MHz}$$

As can be seen from the resulting waveforms in FIG. 2, the data is transferred from FPGA1 102 to FPGA2 104 in less than one DUT cycle (CLK11, CLK12), by choosing to operate the DUT logic at 50 MHz. In particular, the CLK2 waveform, at 1 GHz, is shown at 221. Twenty pulses of CLK2 occur in one pulse of CLK12; the waveform for the latter, at 50 MHz, is shown at 225. DATA 1, designated as 223, begins transmission at the rising edge of pulse 1 in waveform 221. It can be seen, at 227 and 229, that the ten bit demultiplexer output in FPGA2, even with the latency N=8 and extra compensation cycles B=2, reflects complete transmission of DATA 1 in a single cycle of CLK12. DATA 2, designated as 231, begins transmission at the rising edge of pulse 20 in waveform 221, and the corresponding ten bit demultiplexer output in FPGA2 is seen at 233.

Before these links are used to transfer data, they should be trained. Link training is appropriate because the signals travelling from one FPGA to another through a printed circuit board or cables undergo several forms of delay. Since the SerDes macros are not intended to work in more than the 1-2 Gb/s range, the FPGA manufacturers, to reduce the power and area cost, typically do not provide any signal conditioning circuits. This makes it difficult to capture the center of the data eye using the forwarded clock. The process of computing the center of the eye with respect to the sampling clock is commonly referred to as bit alignment. There are several techniques for doing this. The FPGA manufacturers typically provide fine delay elements to help solve this problem. These delay elements can be placed in the clock path or the data path, thus moving one edge with respect to the other. The FPGA manufacturers usually recommend placing the delay elements in the clock path.

However, introducing delay elements in the clock path is typically not suitable for hardware accelerators, because a single forwarded clock is used to sample multiple data channels on the receive side. Thus, the probability of finding a single set of delay elements which will support multiple data eyes is extremely low. One or more embodiments advantageously add the delay elements in the data path.

A step that must typically be taken in eye measurement using delay elements is averaging. Instead of measuring the width of the eye once, one should measure the eye multiple times and an average should be taken to decide the final set of delay elements. This averaging compensates for long term jitter events.

Metastability is another issue which the bit alignment circuits typically suffer from. As the data edge is continuously moved with respect to the clock edge, setup and hold violations can occur at the capture latch. Although this cannot be avoided, it should be detected, or else it can give misleading results in delay computation. In order to detect the metastability, one or more embodiments provide a metastability detection circuit. This can be achieved by sending a low frequency square wave training pattern at the transmitter, which when received will look like a thermometer code at the output of the demultiplexer. Metastability at the first receiver latch will typically always appear in the form of bubbles in the thermometer code. The bubbles can be very easily detected by XORing (that is, applying an eXclusive OR logic function to) the adjacent bits of the demultiplexer output. Once metastability is detected, the sampling point can be changed by adding or removing a delay element from the data path.

Thus, in one or more embodiments, eye measurement is done several times and the number of delay elements added in each attempt are then averaged to arrive at a suitable number to use for the rest of process. Furthermore with regard to the bit alignment procedure, one or more embodiments include bit alignment block being configured to perform bit alignment by, inter alia, detecting metastability in a test pattern. In one or more embodiments, the process comprises of sending a training pattern (for example a low frequency square wave) which at the transmitting end (T in FIG. 4) will look like x00 x00 x0F xFF xFF. At the "R" output, the bit alignment procedure will try to add delays in the data path, so that the receiver pattern at one time instance say x0F changes to x07 (note the shift-right in pattern as the sampling eye moved from one data window to another). Once this happens, one notes the number of delay elements required to cause this shift. The process just described, in and of itself, is known to the skilled artisan to perform delay alignment. To make this procedure useful in a real FPGA environment with thousands of links, one or more embodiments provide metastability detection—as the "appearance of shifting" can be caused by a metastable event, so one or more embodiments employ a metastable detection circuit. Furthermore, known techniques in and of themselves do not address long term jitter issues, so one or more embodiments carry out the eye measurement several times and for reliability, the average number of delay elements is used.

In one or more embodiments, the next step in the link alignment process is called word alignment. It involves shifting the bits received at the demultiplexer output, so as to align the first incoming bit to the desired location of the word, which could be, for example, the most significant bit location. FPGA manufacturers typically provide a word alignment feature for the SerDes. For hardware accelerators, the multiplex ratios can be as high as 100 or more. Current multiplex ratios available in FPGA SerDes macros range from 8 to 16. In order to support the higher requirements of hardware accelerators, one has to build second time domain multiplexers (TDM) and demultiplexers to extend the multiplex ratio of an existing SerDes block. For example, and referring now to FIG. 3, let the FPGA pre-existing SerDes 351 provide a multiplex ratio of 8 to 1, whereas let the DUT requirement for the multiplex ratio be 96 to 1. (Note that element 353 is a demultiplexer.) Therefore, one can build a TDM of 12 to 1 at each input of the 8 to 1 multiplexer, as seen at 355, to achieve an overall multiplex ratio of 96 to 1. A similar demultiplexer can be built at the receiver, as shown at 357. Note that only the first and eighth 12 to 1 TDMs on the input side, i.e., TDM(1) and TDM(8) are shown at 355, with the second through seventh TDMs omitted to avoid clutter and symbolized by the ellipsis. Similarly, only the first and eighth 1 to 12 time division demultiplex units are shown on the receiver side at 357, i.e., time division demultiplex units 1-to-12(1) and 1-to-12(8) are shown, with the second through seventh time division demultiplex units 1-to-12(2) through 1-to-12(7) omitted to avoid clutter and symbolized by the ellipsis.

The hard macro serializer 351 together with the eight TDMs 355 correspond to serializer 116 in FIG. 1. Similarly, the hard macro deserializer 353 together with the eight time division demultiplexers 357 correspond to deserializer 118 in FIG. 1.

Figure 3:
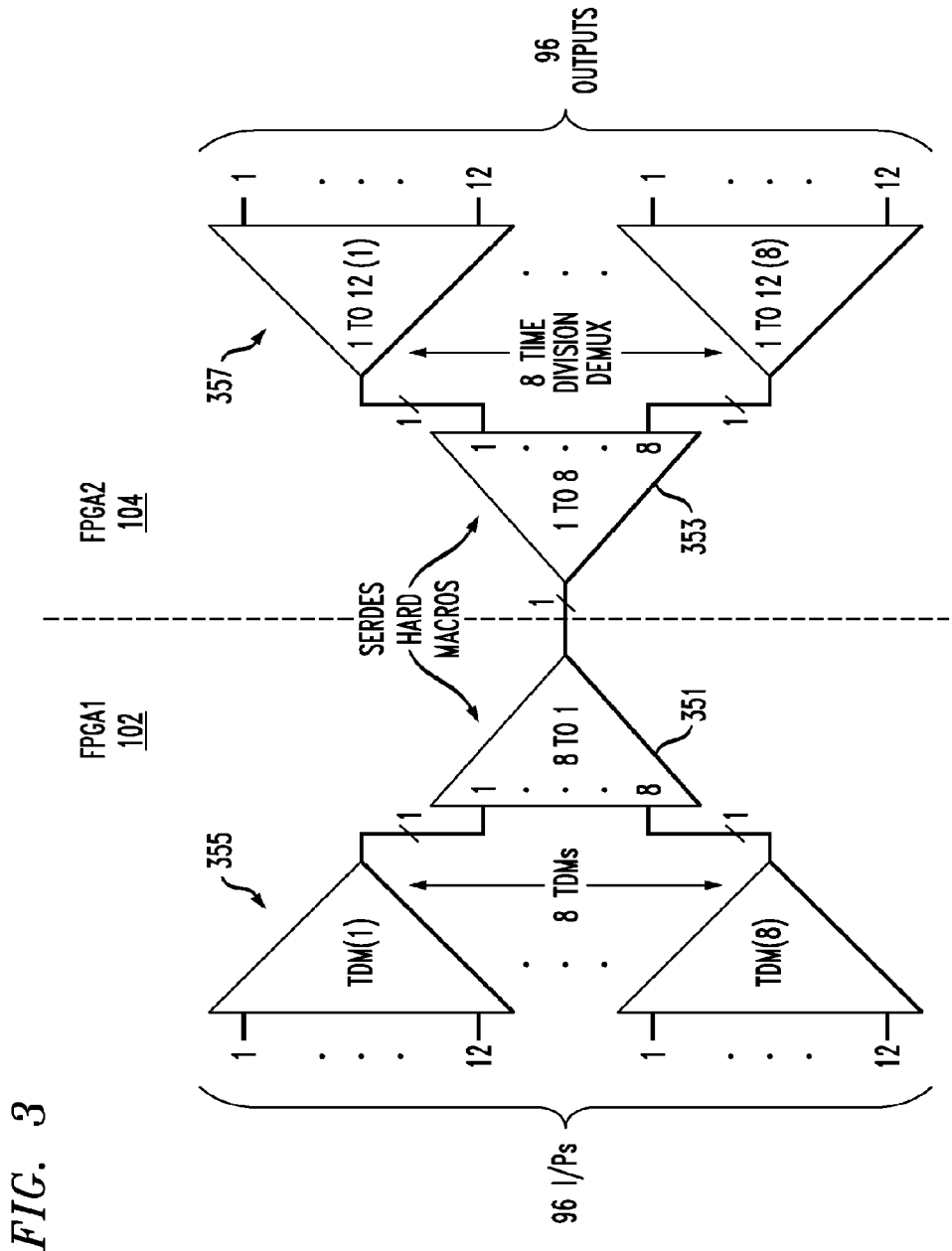
FIG. 3 shows an exemplary time domain multiplexer scheme, according to an aspect of the invention.
Figure 4:
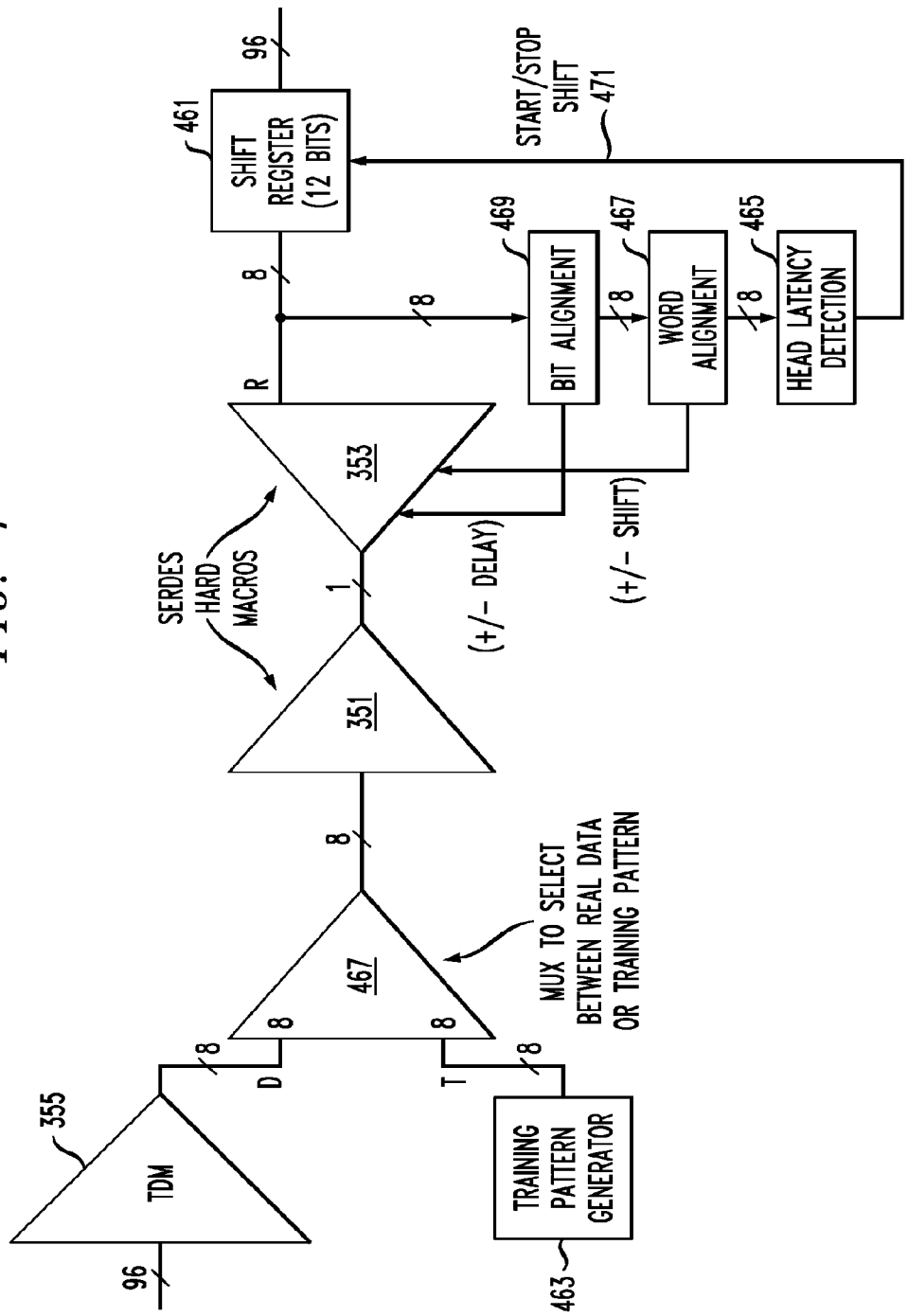
FIG. 4 shows an exemplary transmitter with a training pattern generator and a receiver with a bit, word alignment and a head latency block, according to an aspect of the invention.

Note that in FIGS. 3 and 4, the notation slash "l" through a link with an adjacent numeral denotes the number of data streams in parallel at the given point, i.e., /1 means a single serial stream, /8 means eight streams in parallel, /96 means 96 streams in parallel, and so on. These numerals are thus values of the number of data streams and not reference characters.

Note also, in a preferred embodiment, all elements in FIG. 3, with the exception of the wire 120 (numbered in FIG. 1) are implemented on the FPGAs.

Introduction of TDMs to extend the pre-existing SerDes in FPGAs does not affect the bit alignment, but adds additional complexity to the word alignment, inasmuch as the bit slip mechanism available in the pre-existing SerDes cannot be used to slip the bits of the extended demultiplexer. Thus, an additional circuit is provided in one or more embodiments to perform the word alignment. Indeed, one or more embodiments provide a simple technique to perform this additional bit slip with minimal overhead. To illustrate this, refer again to the example in FIG. 3 of a 12 to 1 multiplexer built on top of an 8 to 1 multiplexer to achieve an overall multiplex ratio of 96 to 1. At the receive end, there will be a hard macro of a 1 to 8 demultiplexer 353 followed by a 1 to 12 demultiplexer as seen at 357. To build the time division demultiplexer of 1 to 12, the easiest way would be to have a 12 bit shift register 461 at each of the eight outputs of 353, as shown in FIG. 4 (only a single 12-bit shift register 461 is shown, to avoid clutter, it being understood that there is one for each of the eight outputs, i.e., each output will have a 12 bit shifter). A small head latency circuit should be added in one or more embodiments, which will perform the function of word alignment. In this regard, note the bit alignment block 469, word alignment block 467, and head latency detection block 465. This word alignment function can be achieved by sending an eight bit pattern from the training block 463 in FIG. 4 exactly once. On detecting this pattern at the node R in the receiver, block 465 sends signal 471 to start the shift operation in the 12 bit shift register 461. This shift operation should then be stopped after 12 shifts. This shift operation can then be repeated periodically for every DUT data front. Here, periodicity is defined by the denominator of equation 2, i.e., M+N+B. This is a single pass word alignment mechanism, which is extremely fast and minimal in area utilization.

After the bit and word alignment is achieved by blocks 469, 467, one could have several data lanes aligned to a single forwarded clock. Define a combination of multiple data lanes aligned to a single clock as a bank. Within a bank, different data lanes will align at different times. In a hardware accelerator, one could have thousands of such banks across multiple FPGAs. As a result, data lanes in different banks will also align at different times. It is possible to design very complex circuits which accurately predict this time. However, inasmuch as this is a problem which is encountered only at startup, one or more embodiments provide a simple time-out mechanism. Both bit alignment 469 and word alignment 467 are allowed to run for a specific time duration. At the end of this time, if the links are aligned, they are marked as good, and if they are not aligned, they are marked as bad.

There is another timing issue which still exists in-spite of the time-out mechanism. This problem arises due to phase differences between the forwarded clock and the equivalent local clock. In literature, this problem is referred to as block alignment and is solved by inserting asynchronous First-In-First-Out circuits called FIFOs. In FPGAs, FIFOs are a scarce resource, and having thousands of them can cause routing issues. To address this, advantageously, one or more embodiments provide a so-called "burning time" technique. Data transfers between two clocks of the same frequency and different phase can cause an ambiguity of ±1 clock cycle, that is, the data could arrive a clock cycle early or a clock cycle late depending on where the two clock edges were placed with respect to each other. Thus, instead of inserting FIFOs, one could choose a larger value for the variable B in Equation 2. As a result, the data at the receiver is guaranteed to be stable before the next DUT clock edge.

With regard to picking a suitable value for B, as noted just above, data transfers between two clocks of the same frequency and different phase can cause an ambiguity of 1 clock cycle, i.e., the data could arrive a clock cycle early or a clock cycle late depending on where the two clock edges were placed with respect to each other. That is to say, an ambiguity of +/−1 cycle means the data will appear at the input of the receiving latch in the current or next cycle. So if one wishes to be very aggressive in design, an additional hold of a single cycle is fine. Since current timing analysis tools are usually "flaky" when it comes to handling multi-cycle paths, it is safer to burn 2 cycles.

Still with attention to FIG. 4, an additional multiplexer 467 is provided to select whether the actual data or the training pattern is provided to the hard macro serializer 351, and thus transmitted to FPGA2 104. The "D" port of unit 467 connects to the eight outputs of the array 355 of TDM(1) to TDM(8). The "T" port of unit 467 connects to the eight outputs of the training pattern generator. The eight outputs of unit 467 connect to the eight inputs of unit 351. Depending on what selector input is provided to unit 467, either the eight outputs of the array 355 of TDM(1) to TDM(8) or the eight outputs of the training pattern generator are provided to the eight inputs of unit 351.

Maintaining cycle accuracy will now be addressed. By introducing the time-out feature for alignment, one not only removes the ambiguity in training time, but also removes the need for back channels to notify the transmitter of the training state of the receiver. It can also be used to separate the training event from the DUT operation event. In order to maintain cycle accuracy, one or more embodiments employ three discrete timing events:

(1) Mark the start of training.
(2) Reset the DUT logic; this could be optional depending upon DUT design.
(3) Start the clocks in the DUT logic.

All the three events can be easily calibrated to an exact number of clock cycles and clock phase, thus achieving cycle reproducibility.

One or more embodiments thus provide a Wire Like Link (WLL) for a high performance, cycle accurate, multi-chip hardware accelerator. One or more instances implement a WLL using a source synchronous transfer mechanism. In this regard, referring to FIG. 1, data sent on link C 120 is synchronous to forwarded clock CLK2, hence called the clock forwarded scheme or source synchronous data transfer scheme. In some cases, a WLL may include bit alignment, word alignment, head latency detection and block alignment circuits in the receiver. By way of clarification, in one or more embodiments, there is no additional circuit for block alignment per se. Rather, clock alignment is achieved, with the depicted circuits, by choosing a ratio between CLK11/12 and CLK2 using equation 2, with particular attention to an appropriate value of variable B.

In one or more embodiments, a WLL includes transmitter circuits to generate training patterns for bit alignment, word alignment, and head latency detection. Given the teachings herein, the skilled artisan can select appropriate patterns. In some instances, a WLL may be be programmable to handle multiple multiplex ratios and variable transfer delays. The bit alignment may, in some cases, perform eye measurement several times and use the average for reliable operation. The bit alignment may also, for example, perform bubble error detection to increase the reliability of eye measurement.

In some cases, a word alignment circuit may be used to correct for word orientation in the receiver. A head latency detection circuit may also be used in some instances to compute the variable latency of a link and mark the boundaries of received data. A block alignment circuit may be used in one or more instances to align all the received signals across all the links to a single clock edge. The block alignment circuit may, for example, burn dead cycles in the receiver to align all the received signals.

Furthermore, a timeout mechanism may be used in some instances in order to remove the ambiguity of training time; a timeout mechanism may be used in training to remove the need of back channel status indication; and/or three discrete time events may be introduced to start training, reset the DUT state, and start the DUT cycles in order to maintain cycle reproducibility.

It should be noted that the skilled artisan will be familiar with hardware elements used herein including FPGAs per se, combinatorial logic per se, registers per se, printed circuit boards and/or cable connections per se, and serializers/multiplexers/deserializers/demultiplexers per se. Given the teachings herein, the skilled artisan will be able to use same to implement one or more embodiments of the invention. Bit alignment block 469 detects metastability as described above, by XORing the adjacent bits of the output of demultiplexer 353; the sampling point is then changed by block 469 by adding or removing a delay element from the data path, as also described above. Bit alignment block 469 may be implemented, for example, by suitably programming the FPGA to implement the logic described elsewhere herein. See also the discussion elsewhere herein of the delay chain with respect to FIG. 7 and accompanying text. Word alignment block 467 works in conjunction with head latency detection block 465 to detect the training pattern and implement the above-described single pass word alignment. Furthermore in this regard, in one or more embodiments, word alignment is a two part process. In the first part, one can use the bit slip mechanism provided by the FPGA vendor to rotate the bits at the output of element 353, till they align with the desired location. In the second part of word alignment, an additional circuit disclosed herein, the head latency detection technique is used to perform word alignment at the output of additional demultiplexer—block 461.

Word alignment block 467 may be implemented, for example, by programming the FPGA to implement the logic described elsewhere herein; for example, to carry out a switching function on block 353 to cause slipping to align the words at the deserializer output. Head latency detection block 465 may be implemented, for example, by suitably programming the FPGA to implement the logic described elsewhere herein. Training pattern generator block 463 may be implemented, in a non-limiting example, by suitably programming the FPGA to provide a plurality of flip-flops arranged to generate a desired pattern; as noted elsewhere herein, the skilled artisan, given the teachings herein, will be able to select appropriate test/training patterns; for example, a slow square wave may be used for bit alignment.

One or more embodiments thus address design of inter-FPGA links and/or achieving low latency of such links. One or more embodiments are cycle accurate and/or cycle reproducible. One or more embodiments provide non-packetized links which can be, for example, extremely low latency non-packetized links. In one or more embodiments the links are point-to-point links. One or more embodiments provide a head latency detector for word alignment.

Given the discussion thus far, it will be appreciated that, in general terms, an exemplary method, according to an aspect of the invention, includes the step of providing first and second field programmable gate arrays FPGA1, designated as 102, and FPGA2, designated as 104. The FPGAs implement, respectively, first and second blocks of a circuit design to be simulated. A further step includes operating the first and second field programmable gate arrays at a first clock frequency (the frequency of CLK11 and CLK12). A still further step includes providing a wire like link to send a plurality of signals, P, between the first and second field programmable gate arrays. The wire like link includes a serializer 116 or 351 plus 355, on the first field programmable gate array, to serialize the plurality of signals; a deserializer 118 or 353 plus 357 on the second field programmable gate array, to deserialize the plurality of signals; and a connection 120 (e.g., via printed circuit board, cable, optical fiber, or the like) between the serializer and the deserializer. An even further step includes operating the serializer and the deserializer at a second clock frequency, $F_t$, greater than the first clock frequency; the second clock frequency is selected such that latency of transmission and reception of the plurality of signals is less than the period corresponding to the first clock frequency, as best seen in FIG. 2—this aspect advantageously provides cycle accurate links as described elsewhere herein.

It will be appreciated that many embodiments may involve large numbers of FPGAs and large numbers of links; for example, on the order of 50 FPGAs and 5000 links; however, these numbers are exemplary and non-limiting.

In some cases, the first and second field programmable gate arrays 102, 104 are clocked at the first clock frequency by first and second clock signals CLK11 and CLK12 which are potentially out of phase with each other, and, in the operating steps, the first clock frequency is no greater than $F_s$ from Equation 2; that is, the first clock frequency is no greater than the second clock frequency $F_t$ divided by the sum of:

N, the number of cycles at the second clock frequency required for a given one of the plurality of signals to propagate from the first field programmable gate array to the second field programmable gate array;

B, the number of extra cycles at the second clock frequency required to compensate for phase differences between the first and second clock signals; and M, which is the total number of signals in the plurality of signals, P, divided by the number of wires, C, available in the connection between the serializer and the deserializer.

Figure 7:
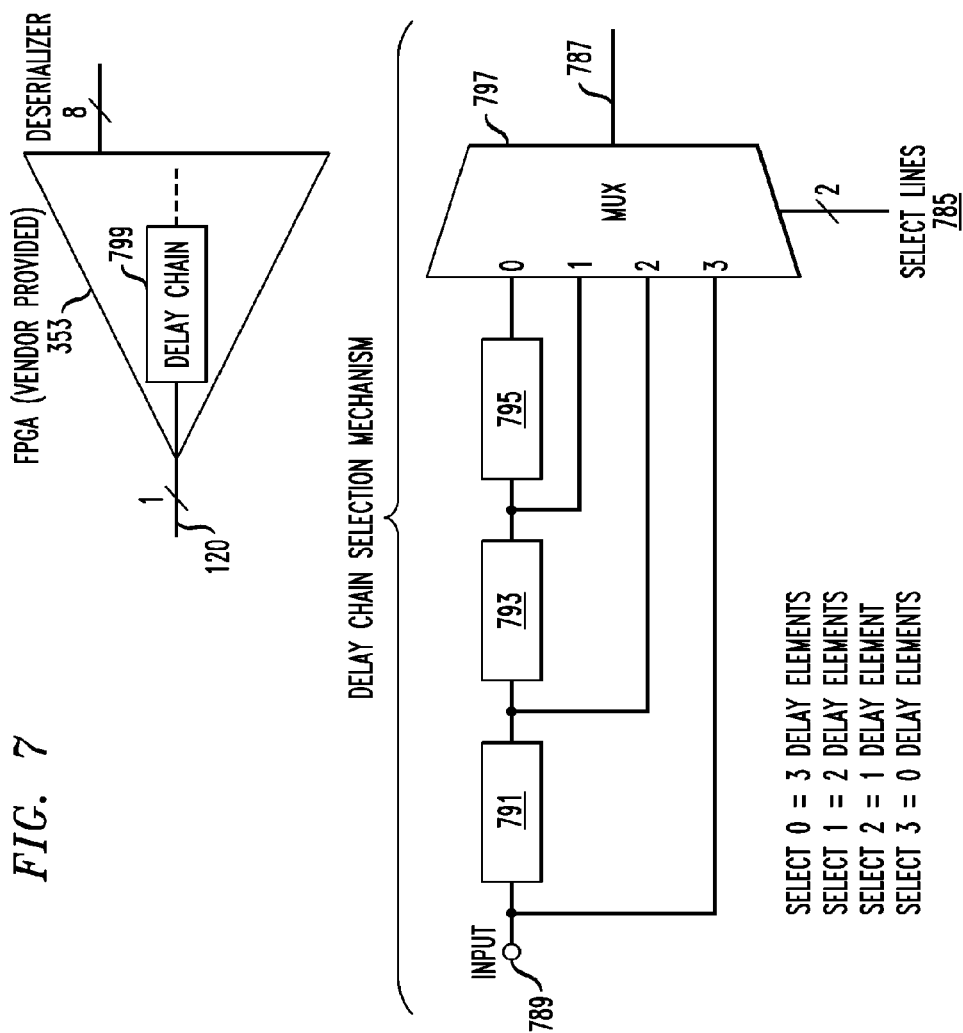
FIG. 7 shows an exemplary embodiment of a delay chain used for bit alignment and a corresponding delay chain selection mechanism, according to an aspect of the invention.

In some cases, bit alignment is performed at the deserializer on the second field programmable gate array by detecting metastability in a test pattern, and adding or removing a delay element in a data path between the first and second field programmable gate arrays to change a sampling point to remove the metastability in the test pattern. The data path refers to the data signal travelling over the physical wire C 120 in FIG. 1. In at least some such cases, an additional step includes generating the test pattern in the first field programmable gate array (e.g., at block 463) and transmitting the test pattern to the second field programmable gate array over the wire like link. Referring now to FIG. 7, many FPGAs have a delay chain that can be programmed to be placed into the data path; for example, immediately upstream of the deserializer 353 or within the deserializer 353 immediately downstream of the input thereof, as seen in FIG. 7. The data passes through the connection 120 and through the delay chain. The chain includes delay elements 791, 793, and 795, interconnected between input 789 and multiplexer 797. Multiplexer 797 has output 787 and select lines 785. If the select lines 785 cause multiplexer 797 to connect port 0 to output 787, three delay elements will be in the chain. If the select lines 785 cause multiplexer 797 to connect port 1 to output 787, two delay elements will be in the chain. If the select lines 785 cause multiplexer 797 to connect port 2 to output 787, one delay element will be in the chain. If the select lines 785 cause multiplexer 797 to connect port 3 to output 787, no delay elements will be in the chain. Thus, by changing the signal on select lines 785, one can change the point at which the clock will sample delayed data.

In some cases, further steps include providing the serializer as macro serializer 351 with a plurality of time domain multiplexers 355 at its inputs; and providing the deserializer as a macro deserializer with a corresponding plurality of time domain multiplexers 357 at its outputs. The corresponding plurality of time domain multiplexers includes a corresponding plurality of shift registers 461 each sized with a number of bits equal to the multiplex ratio of the plurality of time domain multiplexers. In the non-limiting example of FIGS. 3 and 4, the multiplex ratio is 12 to 1 and the shift registers are 12 bit registers. However, any suitable multiple can be chosen, and the value of 12 is entirely exemplary and not intended to be limiting. Further steps in such cases include detecting, with a head latency circuit 465 located at an output node R of the demultiplexer, a test pattern; and, responsive to the detection of the test pattern, commencing a shift operation on the plurality of shift registers for a number of shifts equal to the multiplex ratio of the plurality of time domain multiplexers (see signal 471 in FIG. 4). In at least some such cases, an additional step includes generating the test pattern in the first field programmable gate array (e.g., at block 463) and transmitting the test pattern to the second field programmable gate array over the wire like link.

In some instances, further steps include carrying out a bit alignment process with a bit alignment block 469 of the second field programmable gate array, for a predetermined amount of time; carrying out a word alignment process with a word alignment block 467 of the second field programmable gate array, for the predetermined amount of time; and designating the wire like link as good if the wire like link is aligned at the end of the predetermined amount of time—this aspect advantageously provides cycle reproducibility as described elsewhere herein—different links may get aligned in different numbers of clock cycles so a predetermined amount of time is allowed. This aspect also advantageously allows for removal of bad channels.

In another aspect, time is burned by increasing B; that is, picking the first clock frequency to be no greater than the second clock frequency divided by the sum of:

the number of cycles at the second clock frequency required for the given one of the plurality of signals to propagate from the first field programmable gate array to the second field programmable gate array;

a number greater than the number of extra cycles at the second clock frequency required to compensate for phase differences between the first and second clock signals; and the total number of signals in the plurality of signals, divided by the number of wires available in the connection between the serializer and the deserializer.

In another aspect, an apparatus for simulating a circuit design includes first and second field programmable gate arrays FPGA1 and FPGA2, designated respectively as 102 and 104. These FPGAs implement, respectively, first and second blocks of the circuit design to be simulated. Also provided is at least a first clock source which clocks the first and second field programmable gate arrays such that they operate at a first clock frequency (the frequency of CLK11 and CLK12). Further elements include a wire like link configured to send a plurality of signals between the first and second field programmable gate arrays. The wire like link in turn includes a serializer 116 or 351 plus 355, on the first field programmable gate array, to serialize the plurality of signals; a deserializer 118 or 353 plus 357, on the second field programmable gate array, to deserialize the plurality of signals; and a connection 120 between the serializer and the deserializer (again, e.g., printed circuit board, cable, or the like). A still further element includes at least a second clock source CLK2 which clocks the serializer and the deserializer such that they operate at a second clock frequency, greater than the first clock frequency. The second clock frequency has a value such that latency of transmission and reception of the plurality of signals is less than a period corresponding to the first clock frequency.

In some cases, the first clock source further comprises a third clock source; i.e., the first clock source includes CLK11 and the third clock source CLK12. Terms such as first, second, third, etc. are used for linguistic convenience only. In such cases, the first and second field programmable gate arrays are clocked at the first clock frequency (50 MHz in the non-limiting example of FIG. 2) by the first and third clock sources CLK11 and CLK12 respectively, and the first and third clock sources are potentially out of phase with each other. Furthermore, the first clock frequency is no greater than $F_s$ from Equation 2, as described above with respect to the exemplary method.

In some cases, a further element includes a bit alignment block 469 at the deserializer on the second field programmable gate array. The bit alignment block is configured to perform bit alignment by: detecting metastability in a test pattern, and adding or removing a delay element in a data path between the first and second field programmable gate arrays to change a sampling point to remove the metastability in the test pattern. See also discussion of FIG. 7. In at least some such cases, a still further element includes a training pattern generation block 463 in the first field programmable gate array which generates the test pattern in the first field programmable gate array and transmits the test pattern to the second field programmable gate array over the wire like link.

In some instances, the serializer includes a macro serializer 351 and a plurality of time domain multiplexers 355 at inputs of the macro serializer; and the deserializer includes a macro deserializer 353 and a corresponding plurality of time domain multiplexers 357 at outputs of the macro deserializer. The corresponding plurality of time domain multiplexers include a corresponding plurality of shift registers 461, each sized with a number of bits equal to the multiplex ratio of the plurality of time domain multiplexers (as discussed above, 12 to 1 in the non-limiting example such that the register 461 is a 12 bit register); again, 12 is a non-limiting exemplary value. A still further element includes a head latency circuit 465, located at an output node R of the demultiplexer, and configured to detect a test pattern, and, responsive to detection of the test pattern, send a signal 471 to cause the plurality of shift registers to commence a shift operation for a number of shifts equal to the multiplex ratio of the plurality of time domain multiplexers. In at least some such cases, a still further element includes a training pattern generation block 463 in the first field programmable gate array which generates the test pattern in the first field programmable gate array and transmits the test pattern to the second field programmable gate array over the wire like link.

Some embodiments include a bit alignment block 469 in the second field programmable gate array, configured to carry out a bit alignment process for a predetermined amount of time; and a word alignment block 467 in the second field programmable gate array, configured to carry out a word alignment process for the predetermined amount of time. The wire like link is designated as good if the wire like link is aligned at the end of the predetermined amount of time. In one or more embodiments, each alignment procedure has a flag at the end, which is raised when successful or lowered when the process failed. This status flag is then used to mark the faulty links.

In another aspect, as noted above with respect to the method, time is burned by increasing B; that is, the first clock frequency is selected to be no greater than the second clock frequency divided by the sum of:

the number of cycles at the second clock frequency required for the given one of the plurality of signals to propagate from the first field programmable gate array to the second field programmable gate array;

a number greater than the number of extra cycles at the second clock frequency required to compensate for phase differences between the first and second clock signals; and the total number of signals in the plurality of signals, divided by the number of wires available in the connection between the serializer and the deserializer.

In this manner, time is burned in the second field programmable gate array so that data received at the second field programmable gate array is stabilized prior to a next clock edge of the third clock source CLK12.

Embodiments of the invention also contemplate one or more design structures, discussed further below with respect to FIG. 5. Such design structure(s) are, in one or more embodiments, tangibly embodied in a non-transitory manner in a machine readable medium. In some cases, such a design structure includes instructions which cause first and second field programmable gate arrays to implement, respectively, first and second blocks of a circuit design to be simulated. The first field programmable gate array has as a macro thereon at least a portion of a serializer to serialize a plurality of signals to be sent over a wire like link between the first and second field programmable gate arrays. Optionally, instructions may be provided to cause the first FPGA to implement other portions of the serializer, such as 355. The second field programmable gate array has as a macro thereon at least a portion of a deserializer to deserialize the plurality of signals. Optionally, instructions may be provided to cause the second FPGA to implement other portions of the deserializer, such as 357. The design structure further includes instructions which cause the first and second field programmable gate arrays to implement at least one port for receiving a signal from at least a first clock source which clocks the first and second field programmable gate arrays such that they operate at a first clock frequency, and instructions which cause the first and second field programmable gate arrays to implement at least one port for receiving a signal from at least a second clock source which clocks the serializer and the deserializer such that they operate at a second clock frequency, greater than the first clock frequency. The second clock frequency having a value such that latency of transmission and reception of the plurality of signals is less than a period corresponding to the first clock frequency. In the most general case, the clocks per se may be located on, and/or external to, the FPGAs.

Optionally, the design structure further includes instructions which cause the second field programmable gate array to implement a bit alignment block which carries out a bit alignment process for a predetermined amount of time; instructions which cause the second field programmable gate array to implement a word alignment block which carries out a word alignment process for the predetermined amount of time; and instructions which cause the wire like link to be designated as good if the wire like link is aligned at an end of the predetermined amount of time.

In still another aspect, a method includes providing a design structure of the kind just described, with or without any one, some, or all of the optional features, and transmitting instructions corresponding to the design structure. They may be transmitted over a network, over a cable, by sending a tangible storage medium, or the like. For example, they may be transmitted from a computer to one or more FPGAs over a cable; from a flash memory to an FPGA; or over a local or wide area network. In some cases, where even further speed enhancement is desired, in the transmitting step, the transmitting is to an application specific integrated circuit fabricator, and a further step includes receiving, from the application specific integrated circuit fabricator, an application specific integrated circuit which mimics the programmed first and second field programmable gate arrays.

Techniques described herein can be used in the design and/or simulation of integrated circuit chips. The integrated circuit chips that are ultimately manufactured in accordance with the design simulations can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 5:
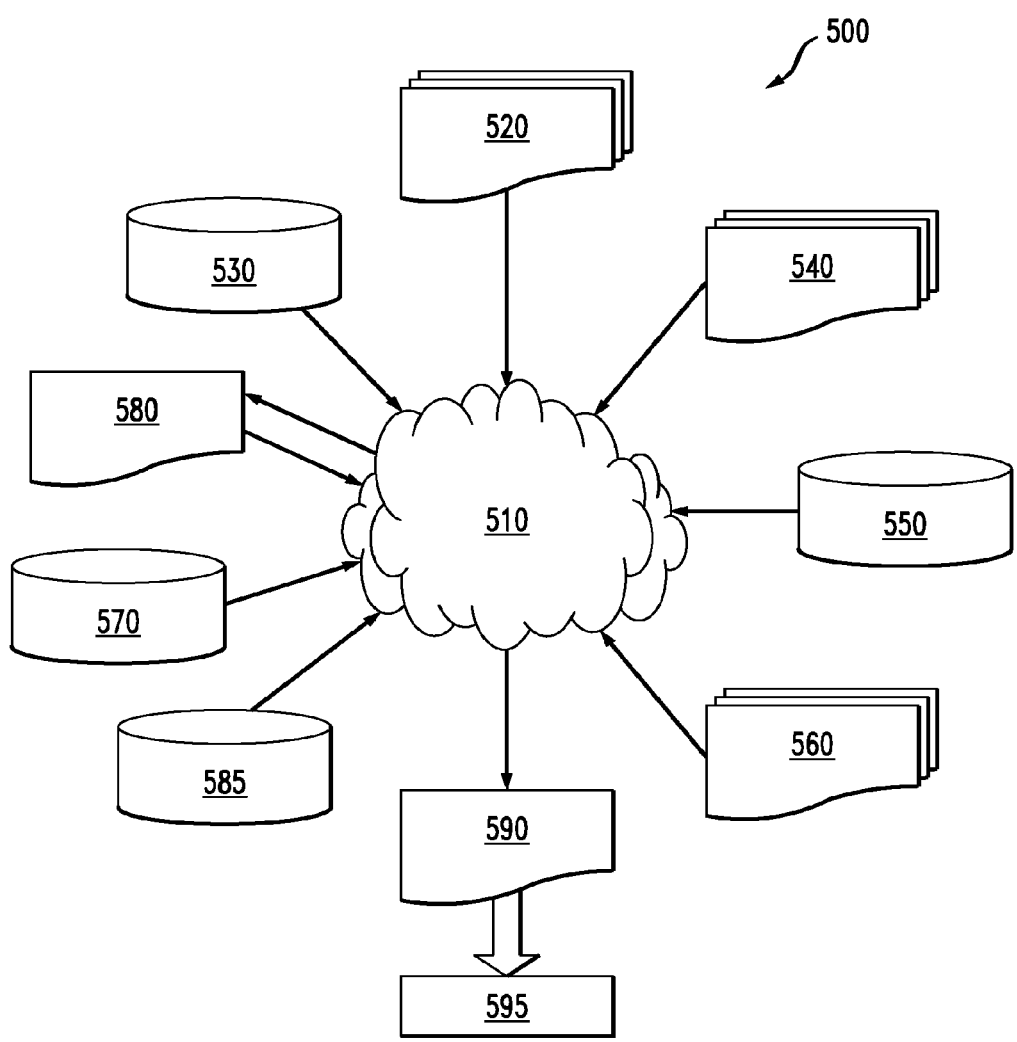
FIG. 5 is a flow diagram of a design process used in semiconductor design, manufacture, and/or test.

FIG. 5 shows a block diagram of an exemplary design flow 500 used for example, in semiconductor IC logic design, simulation, test, layout, and manufacture. The design flow shown in FIG. 5 has relevance to one or more embodiments of the invention in three ways; namely:

(i) it shows an exemplary role of simulation, and such simulations may be carried out much more rapidly than heretofore using FPGAs with wire like links in accordance with one or more embodiments;

(ii) it also shows a process similar to that which might be used to lay out printed circuit boards 106 to interconnect multiple FPGAs in accordance with aspects of the invention; such printed circuit boards (designed, for example, in accordance with Equations 1 and 2) could be represented as design structures as discussed herein; and (iii) the FPGA programming that implements the structures in FIGS. 1-4 and 7 could itself be a design structure that is sent to a fabrication house to fabricate an ASIC for even faster simulations.

Design flow 500 includes processes, machines and/or mechanisms for processing design structures or devices to generate logically or otherwise functionally equivalent representations of design structures and/or devices. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc. FIG. 5 illustrates multiple such design structures including an input design structure 520 that is preferably processed by a design process 510. Design structure 520 may be a logical simulation design structure generated and processed by design process 510 to produce a logically equivalent functional representation of a hardware element. Design structure 520 may also or alternatively comprise data and/or program instructions that when processed by design process 510, generate a functional representation of the physical structure of a hardware element. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more circuits, physical structures, or the like. In one embodiment, design structure 590 may comprise a compiled, executable HDL simulation model that functionally simulates the circuits, physical structures, or the like.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 590 may then proceed to a stage 595 where, for example, design structure 590: proceeds to tape-out, is released to manufacturing, is released to a mask house, is sent to another design house, is sent back to the customer, etc.

Exemplary System and Article of Manufacture Details

Figure 6:
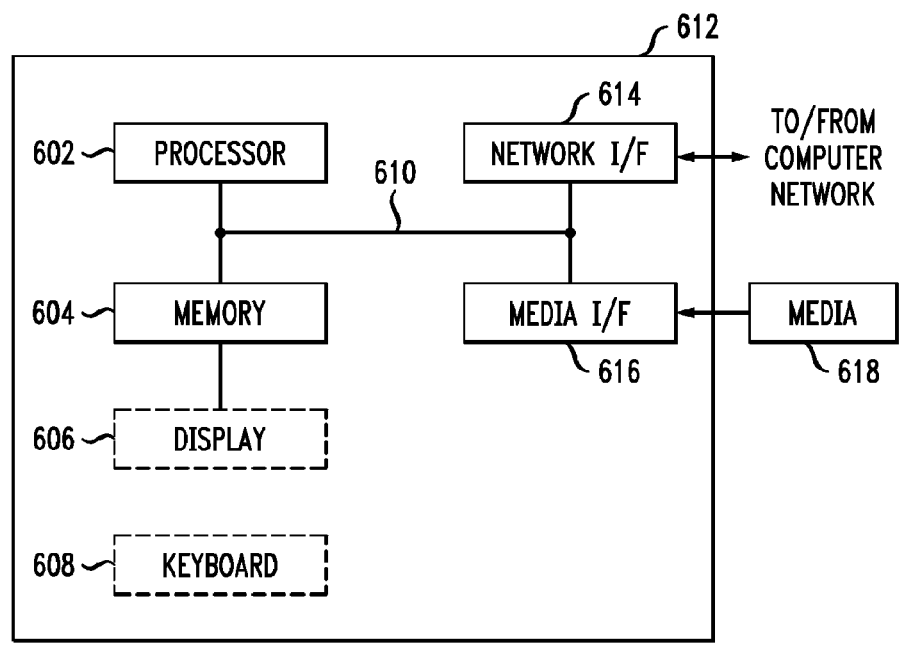
FIG. 6 depicts a computer system that may be useful in implementing some aspects and/or elements of the invention, such as in automating a design process as shown in FIG. 5.

Some aspects can make use of software running on a general purpose computer or workstation; namely, a general purpose computer or workstation, with appropriate software, can be used to initially program an FPGA (after which the programming can simply be included in a flash memory accessible to the FPGA); and a general purpose computer or workstation can be used to run software aspects of the process shown in FIG. 5. With reference to FIG. 6, such a general purpose computer might include, for example, a processor 602, a memory 604, and an input/output interface formed, for example, by a display 606 and a keyboard 608. The term "processor" as used, in connection with FIG. 6, to include any processing device, such as, for example, one that includes a CPU (central processing unit) and/or other forms of processing circuitry. Further, the term "processor" in connection with FIG. 6 may refer to more than one individual processor. The term "memory" in connection with FIG. 6 is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein in connection with FIG. 6, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618. Interface 614 or a different interface can be sued to program the FPGA(s), for example.

Terminology used with respect to FIG. 6 and its accompanying description may be used in a different sense in other locations herein and this will be appreciated from the context.

Computer software including instructions or code for performing FPGA programming and/or software aspects of the design process of FIG. 5 may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, a "server" includes a physical data processing system (for example, system 612 as shown in FIG. 6) running a server program. It will be understood that such a physical server may or may not include a display and keyboard.

Computer instructions may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 618 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code may be written, for example, in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Software aspects such as software which facilitates programming of FPGA(s) and/or carrying out software-related aspects of FIG. 5 may include providing a system comprising distinct software modules embodied on a computer readable storage medium to implement appropriate functionality.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of operating a hardware simulator comprising a plurality of field programmable gate arrays, said method comprising:
    operating, at a first clock frequency, first and second blocks of a circuit design simulated by first and second field programmable gate arrays, respectively;
    sending a plurality of signals between said first and second field programmable gate arrays via a wire like link, said wire like link comprising:
        a serializer, on said first field programmable gate array, to serialize said plurality of signals;
        a deserializer on said second field programmable gate array, to deserialize said plurality of signals; and
        a connection between said serializer and said deserializer; and
    operating said serializer and said deserializer at a second clock frequency, greater than said first clock frequency, said second clock frequency being selected such that latency of transmission and reception of said plurality of signals is less than a period corresponding to said first clock frequency.

2. The method of claim 1, further comprising:
    driving respective states of said first and second blocks of said circuit design at said first clock frequency by first and second clock signals, which are potentially out of phase with each other, input to respective registers of said first and second field programmable gate arrays; and
    in said operating steps, said first clock frequency is no greater than said second clock frequency divided by a sum of:
    a number of cycles at said second clock frequency required for a given one of said plurality of signals to propagate from said first field programmable gate array to said second field programmable gate array;
    a number of extra cycles at said second clock frequency required to compensate for phase differences between said first and second clock signals; and
    a total number of signals in said plurality of signals, divided by a number of wires available in said connection between said serializer and said deserializer.

3. The method of claim 2, further comprising performing bit alignment at said deserializer on said second field programmable gate array by:
    detecting metastability in a test pattern; and
    adding or removing a delay element in a data path between said first and second field programmable gate arrays to change a sampling point to remove said metastability in said test pattern.

4. The method of claim 3, further comprising generating said test pattern in said first field programmable gate array and transmitting said test pattern to said second field programmable gate array over said wire like link.

5. The method of claim 4, further comprising:
repeating said steps of generating said test pattern and adding or removing said delay element for a plurality of data eye measurement trials;
selecting an average value of a number of delay elements added or removed during said data eye measurement trials; and
configuring at least one of said connection and said deserializer in accordance with said average value.

6. The method of claim 2, further comprising:
providing said serializer as a macro serializer and a plurality of time domain multiplexers at inputs of said serializer;
providing said deserializer as a macro deserializer and a corresponding plurality of time domain multiplexers at outputs of said deserializer, said corresponding plurality of time domain multiplexers comprising a corresponding plurality of shift registers each sized with a number of bits equal to a multiplex ratio of said plurality of time domain multiplexers;
detecting, with a head latency circuit located at an output node of said demultiplexer, a test pattern; and
responsive to said detection of said test pattern, commencing a shift operation on said plurality of shift registers for a number of shifts equal to said multiplex ratio of said plurality of time domain multiplexers.

7. The method of claim 2, further comprising:
carrying out a bit alignment process with a bit alignment block of said second field programmable gate array, for a predetermined amount of time;
carrying out a word alignment process with a word alignment block of said second field programmable gate array, for said predetermined amount of time; and
designating said wire like link as good if said wire like link is aligned at an end of said predetermined amount of time.

8. The method of claim 2, further comprising burning time by picking said first clock frequency to be no greater than said second clock frequency divided by a sum of:
said number of cycles at said second clock frequency required for said given one of said plurality of signals to propagate from said first field programmable gate array to said second field programmable gate array;
a number greater than said number of extra cycles at said second clock frequency required to compensate for phase differences between said first and second clock signals; and
said total number of signals in said plurality of signals, divided by said number of wires available in said connection between said serializer and said deserializer.

9. The method of claim 1, further comprising choosing said first clock frequency such that said latency of transmission and reception of said plurality of signals is less than said period corresponding to said first clock frequency, wherein said period is less than one clock cycle of the circuit design.

10. An apparatus for simulating a circuit design, said apparatus comprising:
first and second field programmable gate arrays implementing, respectively, first and second blocks of the circuit design;
at least a first clock source which drives respective states of said first and second blocks of the circuit design simulated by said first and second field programmable gate arrays at a first clock frequency;
a wire like link configured to send a plurality of signals between said first and second field programmable gate arrays, said wire like link in turn comprising:
a serializer, on said first field programmable gate array, to serialize said plurality of signals;
a deserializer on said second field programmable gate array, to deserialize said plurality of signals; and
a connection between said serializer and said deserializer; and
at least a second clock source which clocks said serializer and said deserializer such that they operate at a second clock frequency, greater than said first clock frequency, said second clock frequency having a value such that latency of transmission and reception of said plurality of signals is less than a period corresponding to said first clock frequency.

11. The apparatus of claim 10, wherein:
said first clock source further comprises a third clock source;
driving said respective states of said first and second blocks of said circuit design at said first clock frequency by said first and third clock sources respectively, said first and third clock sources being potentially out of phase with each other, said first and third clock sources inputting respective clock signals into to respective registers of said first and second field programmable gate arrays; and
said first clock frequency is no greater than said second clock frequency divided by a sum of:
a number of cycles at said second clock frequency required for a given one of said plurality of signals to propagate from said first field programmable gate array to said second field programmable gate array;
a number of extra cycles at said second clock frequency required to compensate for phase differences between said first and second clock signals; and
a total number of signals in said plurality of signals, divided by a number of wires available in said connection between said serializer and said deserializer.

12. The apparatus of claim 11, further comprising:
a delay chain in said connection; and
a bit alignment block at said deserializer on said second field programmable gate array, said bit alignment block being configured to perform bit alignment by:
detecting metastability in a test pattern; and
adding or removing a delay element in said delay chain to change a sampling point to remove said metastability in said test pattern.

13. The apparatus of claim 12, further comprising a training pattern generation block in said first field programmable gate array which generates said test pattern in said first field programmable gate array and transmits said test pattern to said second field programmable gate array over said wire like link.

14. The apparatus of claim 13, wherein said bit alignment block and said training pattern generation block are cooperatively configured to:
repeat said generating of said test pattern and said adding or removing of said delay element for a plurality of data eye measurement trials;
select an average value of a number of delay elements added or removed during said data eye measurement trials; and
configure at least one of said connection and said deserializer in accordance with said average value.

15. The apparatus of claim 11, wherein:
said serializer comprises a macro serializer with a plurality of inputs, and a plurality of time domain multiplexers at said inputs of said macro serializer; and said deserializer comprises a macro deserializer with a plurality of outputs, and a corresponding plurality of time domain multiplexers at said outputs of said deserializer, said corresponding plurality of time domain multiplexers comprising a corresponding plurality of shift registers each sized with a number of bits equal to a multiplex ratio of said plurality of time domain multiplexers;

further comprising a head latency circuit, located on said second field programmable gate array at an output node of said demultiplexer, and configured to detect a test pattern, and, responsive to said detection of said test pattern, send a signal to cause said plurality of shift registers to commence a shift operation for a number of shifts equal to said multiplex ratio of said plurality of time domain multiplexers.

16. The apparatus of claim 15, further comprising a training pattern generation block in said first field programmable gate array which generates said test pattern in said first field programmable gate array and transmits said test pattern to said second field programmable gate array over said wire like link.

17. The apparatus of claim 11, further comprising:
a bit alignment block in said second field programmable gate array, configured to carry out a bit alignment process for a predetermined amount of time;
a word alignment block in said second field programmable gate array, configured to carry out a word alignment process for said predetermined amount of time; and
a flag mechanism which designates said wire like link as good if said wire like link is aligned at an end of said predetermined amount of time.

18. The apparatus of claim 11, wherein said first clock frequency is no greater than said second clock frequency divided by a sum of:
said number of cycles at said second clock frequency required for said given one of said plurality of signals to propagate from said first field programmable gate array to said second field programmable gate array;
a number greater than said number of extra cycles at said second clock frequency required to compensate for phase differences between said first and second clock signals; and
said total number of signals in said plurality of signals, divided by said number of wires available in said connection between said serializer and said deserializer;
whereby time is burned in said second field programmable gate array so that data received at said second field programmable gate array is stabilized prior to a next clock edge of said third clock source.

19. An apparatus comprising:
means for operating, at a first clock frequency, first and second blocks of a circuit design simulated by said first and second field programmable gate arrays, respectively;
means for sending a plurality of signals between said first and second field programmable gate arrays via a wire like link, said wire like link comprising:
a serializer, on said first field programmable gate array, to serialize said plurality of signals;
a deserializer on said second field programmable gate array, to deserialize said plurality of signals; and
a connection between said serializer and said deserializer; and
means for operating said serializer and said deserializer at a second clock frequency, greater than said first clock frequency, said second clock frequency being selected such that latency of transmission and reception of said plurality of signals is less than a period corresponding to said first clock frequency.

20. The apparatus of claim 19, further comprising:
means for carrying out a bit alignment process with a bit alignment block of said second field programmable gate array, for a predetermined amount of time;
means for carrying out a word alignment process with a word alignment block of said second field programmable gate array, for said predetermined amount of time; and
means for designating said wire like link as good if said wire like link is aligned at an end of said predetermined amount of time.

21. A non-transitory machine readable medium embodying a design structure, the design structure embodied on the non-transitory medium in turn comprising:
instructions which cause first and second field programmable gate arrays to implement, respectively, first and second blocks of a circuit design, said first field programmable gate array having as a macro thereon at least a portion of a serializer to serialize a plurality of signals to be sent over a wire like link between said first and second field programmable gate arrays, said second field programmable gate array having as a macro thereon at least a portion of a deserializer to deserialize said plurality of signals;
instructions which cause said first and second field programmable gate arrays to implement at least one port for receiving a signal from at least a first clock source which drives respective states of said first and second blocks of said circuit design at a first clock frequency;
instructions which cause said first and second field programmable gate arrays to implement at least one port for receiving a signal from at least a second clock source which clocks said serializer and said deserializer such that they operate at a second clock frequency, greater than said first clock frequency, said second clock frequency having a value such that latency of transmission and reception of said plurality of signals is less than a period corresponding to said first clock frequency.

22. The non-transitory machine readable medium claim 21, wherein the design structure embodied on the non-transitory machine readable medium further comprises:
instructions which cause said second field programmable gate array to implement a bit alignment block which carries out a bit alignment process for a predetermined amount of time;
instructions which cause said second field programmable gate array to implement a word alignment block which carries out a word alignment process for said predetermined amount of time; and
instructions which cause said wire like link to be designated as good if said wire like link is aligned at an end of said predetermined amount of time.

23. A method comprising:
providing a non-transitory machine readable medium embodying a design structure, the design structure embodied on the non-transitory medium in turn comprising:
instructions which cause first and second field programmable gate arrays to implement, respectively, first and second blocks of a circuit design, said first field programmable gate array having as a macro thereon at least a portion of a serializer to serialize a plurality of signals to be sent over a wire like link between said first and second field programmable gate arrays, said second field programmable gate array having as a macro thereon at least a portion of a deserializer to deserialize said plurality of signals;

instructions which cause said first and second field programmable gate arrays to implement at least one port for receiving a signal from at least a first clock source which drives respective states of said first and second blocks of said circuit design at a first clock frequency; and instructions which cause said first and second field programmable gate arrays to implement at least one port for receiving a signal from at least a second clock source which clocks said serializer and said deserializer such that they operate at a second clock frequency, greater than said first clock frequency, said second clock frequency having a value such that latency of transmission and reception of said plurality of signals is less than a period corresponding to said first clock frequency; and transmitting instructions corresponding to said design structure.

24. The method of claim 23, wherein, in said transmitting step, said transmitting is to an application specific integrated circuit fabricator, further comprising receiving, from said application specific integrated circuit fabricator, an application specific integrated circuit which mimics said programmed first and second field programmable gate arrays.

* * * * *